United States Patent
Ohlhoff et al.

(10) Patent No.: US 7,197,678 B2
(45) Date of Patent: Mar. 27, 2007

(54) TEST CIRCUIT AND METHOD FOR TESTING AN INTEGRATED MEMORY CIRCUIT

(75) Inventors: Carsten Ohlhoff, München (DE); Peter Beer, Tutzing (DE)

(73) Assignee: Infineon Technologies AG, Munich (DE)

( * ) Notice: Subject to any disclaimer, the term of this patent is extended or adjusted under 35 U.S.C. 154(b) by 500 days.

(21) Appl. No.: 10/613,367

(22) Filed: Jul. 3, 2003

(65) Prior Publication Data

US 2004/0015757 A1 Jan. 22, 2004

(30) Foreign Application Priority Data

Jul. 3, 2002 (DE) ............................... 102 29 802

(51) Int. Cl.
*G11C 29/00* (2006.01)
*G11C 7/00* (2006.01)

(52) U.S. Cl. ........................ 714/719; 365/201
(58) Field of Classification Search ........ 714/718–723, 714/701; 365/201
See application file for complete search history.

(56) References Cited

U.S. PATENT DOCUMENTS

| 5,561,671 | A | * | 10/1996 | Akiyama | 714/799 |
| 5,961,653 | A | * | 10/1999 | Kalter et al. | 714/7 |
| 6,072,737 | A | * | 6/2000 | Morgan et al. | 365/201 |
| 6,138,257 | A | * | 10/2000 | Wada et al. | 714/724 |
| 6,442,724 | B1 | * | 8/2002 | Augarten | 714/738 |
| 6,539,505 | B1 | | 3/2003 | Dähn | 714/718 |
| 6,691,272 | B2 | * | 2/2004 | Azim | 714/744 |

FOREIGN PATENT DOCUMENTS

DE 199 22 786 A1 12/2000

OTHER PUBLICATIONS

"Processor-Programmable Memory BIST for Bus-Connected Embedded Memories" by Ching-Hong Tsai and Cheng-Wen Wu This paper appears in: Proceedings of the ASP-DAC 2001, Publication Date: 2001 pp. 325-330 INSPEC Accession No. 6924510.*

* cited by examiner

*Primary Examiner*—Guy Lamarre
*Assistant Examiner*—Cynthia Britt
(74) *Attorney, Agent, or Firm*—Laurence A. Greenberg; Werner H. Stemer; Ralph E. Locher

(57) ABSTRACT

A test circuit for testing a memory circuit has a data input line for providing test data and a comparator unit. The comparator unit is connected to the data input line and to the memory circuit for comparing the test data written into the memory circuit with the test data read from the memory area. The data input line is connected to the memory circuit via a data change circuit. The data change circuit is controllable depending on a result of a comparison in the comparator unit such that when an error occurs, subsequent test data can be written in an altered manner to the memory circuit.

12 Claims, 4 Drawing Sheets

TEST CIRCUIT AND METHOD FOR TESTING AN INTEGRATED MEMORY CIRCUIT

BACKGROUND OF THE INVENTION

Field of the Invention

The invention relates to a test circuit and a method for testing an integrated memory circuit.

Large scale integrated semiconductor memory chips (DRAMs) cannot be produced in a manner free from errors with a sufficient yield. Often there are only a few memory cells on a memory chip that are defective. These are identified during production in a functional test and replaced by so-called redundant memory cells.

The testing is carried out by addresses of the defective cells being transmitted to an external test system, which is connected to the memory chip for the testing, and a repair solution being calculated on the basis of the data. The repair solution establishes which defective cell is to be repaired with which redundant cell. The addresses are determined on the basis of error data that result from the comparison of written and read-out test data.

For this purpose, test systems for large scale integrated semiconductor memories, such as DRAMs, are provided with additional hardware, such as, for example, a bit fail map memory, which serves for storing the error addresses, and special processes which carry out the redundancy calculation.

In order to minimize the test costs per component, the memory modules are increasingly being tested in parallel. This trend is supplemented by the increasing use of test-supporting circuits such as a built-in self-test (BIST) or compression test modes. With the use of a BIST, the test control is affected almost completely in the memory module.

What proves to be increasingly problematic in this context is that the repair solution still has to be calculated externally, namely in the external test system. Therefore, even in the case of a BIST-based test sequence, the redundancy-conforming error data have to be transmitted to an external test unit that collects the errors and calculates a repair solution therefrom. The transmission of the error data constitutes a major problem particularly given high parallelism and large storage densities of a memory module, such as, for example, 512 Mbits per module.

Two paths are followed nowadays in order to cope with these large volumes of data.

a) The data are transmitted in a highly parallel fashion from each individual memory module. This requires a correspondingly high number of expensive tester channels at the external test system or data acquisition system. Furthermore, the wiring at the tester interfaces of the test systems may become very complex.

b) In order to reduce the number of lines per memory module to be tested, the error addresses of the errors detected in the memory module can be transmitted serially to the external test system. This requires correspondingly more time and thus likewise leads to rising test costs since the total test duration for a memory module increases.

Whereas the number of memory modules to be tested in parallel is limited by the number of available tester channels in the case of the first alternative, in the case of the second alternative the throughput of the test system is limited by the fact that the time for testing a memory module is increased.

Published, Non-Prosecuted German Patent Application DE 199 22 786 A1, corresponding to U.S. Pat. No. 6,539, 505 B1, discloses using a part of the tested memory device that is currently not being tested for accumulating and buffer-storing test results.

SUMMARY OF THE INVENTION

It is accordingly an object of the invention to provide a test circuit and a method for testing an integrated memory circuit that overcomes the above-mentioned disadvantages of the prior art devices and methods of this general type, which can be used to accelerate the testing of integrated memory circuits. Furthermore, the intention is to provide a method that enables a memory circuit to be tested more rapidly.

With the foregoing and other objects in view there is provided, in accordance with the invention, a test circuit for testing a memory circuit. The test circuit contains a data input line for providing test data to be written to the memory circuit and a comparator unit connected to the data input line and to the memory circuit. The comparator unit compares expected values received over the data input line with the test data read from the memory circuit, the test data previously having been written to the memory circuit over the data input line. A data change circuit is connected between the data input line and the memory circuit. The data change circuit is controllable in dependence on a result of a comparison performed in the comparator unit such that when an error occurs, further test data can be written to the memory circuit in a manner altered by the data change circuit.

The invention provides a test circuit for testing an integrated memory circuit. The test circuit has a data input line for providing the test data and a comparator unit, which is connected to the data input line and the memory circuit. Expected values received via the data line are compared with the aid of the test data read from the memory area, the test data previously having been written to the memory area via the data input line. In this case, the expected values preferably correspond to the test data previously written to the memory area, so that when an error occurs, the expected values deviate from the read-out test data. The data input line is connected to the memory circuit via a data change circuit. The data change circuit being controllable depending on the result of the comparison in the comparator unit such that when an error occurs, subsequent test data can be written to the memory circuit in a manner altered by the data change circuit.

In the case of such a test circuit, the volume of data transmitted toward the outside can be reduced by the addresses of the defective cells first being compressed in a redundancy-conforming manner internally within the memory. In this context, in a redundancy-conforming manner means that the compression causes no loss of relevant information for the subsequent calculation of the repair solution.

It is usually the case that test data are written to each memory area and subsequently read out again a number of times during the testing of a memory module. An error is detected if the written-in data and the read-out data deviate from one another. During a typical test, the writing in and reading out are carried out repeatedly on an address range, in which case specific parameters of the memory circuit (e.g. applied supply voltage, frequency, temperature, etc.) or the data patterns are altered between the individual write and read steps, so that soft errors are also detected. For this reason., the same memory area is repeatedly tested under different conditions, an error that is repeatedly ascertained there, in the case of conventional test systems, also being repeatedly transmitted to the external test unit in the event of each read access. This is the case, for example, with a hard error, where the tested memory cell is identified as defective under any condition.

In the case of the test circuit according to the invention, by contrast, it is provided that, as soon as an error has occurred, an error is detected for the corresponding memory area during subsequent test runs as well. In other words, an error is repeatedly indicated during the subsequent testing of the memory area, even if an error occurs in the memory area only under a specific condition and, as a result, the error would not be detected during the subsequent test sequences. As a result, unlike hitherto, it is not necessary to transmit error data to the external test unit after each write and read-out operation, but rather only after the end of a test run with a plurality of write and read-out operations.

The error data from a series of a plurality of write/read operations can then be determined by transmitting the results of the last write/read operation to the external tester unit.

In this way, the volume of data which is transmitted to the external tester system can be considerably reduced since the error data collected during the plurality of write/read operations, in the form of the results of the last comparison between written-in and read-out test data, have to be transmitted to the external test system only once per test.

In accordance with a further aspect of the present invention, it is provided that a plurality of data input lines are provided which are each connected to a data change circuit, the data change circuits being controllable via the comparator unit such that when an error occurs in a memory area addressed via one of the data input lines, the data change circuit is controllable such that subsequent test data on the plurality of data input lines of the data change circuit can be written to the memory circuit in an altered manner.

When replacing defective memory areas by redundant memory areas, it is provided that the memory area to be tested has blocks with a plurality of memory cells which can in each case be replaced by a block of redundant memory cells of the same size. The defective block must be replaced as soon as at least one of the memory cells of the respective block is defective.

For this reason, without restricting the repairability, it is possible, when an error occurs in a memory cell of the memory area, to "mark" the relevant block as defective by subsequently writing the test data for the block in an altered manner to all the memory cells of the relevant block. Thus, for all the memory cells of the relevant block, during subsequent test operations, an error is detected during the comparison between the written-in and read-out test data. The errors detected in the memory circuit are stored in the memory circuit itself in that, after a read-out operation in which errors can be detected, a subsequent write operation is carried out in which data are written to the memory circuit in an altered or unaltered manner.

It is preferably provided that the data change circuit has a controllable exclusive-OR gate which, depending on a control signal generated by the comparator device, passes the test data in unaltered form to the memory unit or alters the test data with the aid of an exclusive-OR function. An exclusive-OR gate is particularly suitable for the data change circuit since this function inverts a binary signal present at the input of the exclusive-OR gate and thus always alters the datum.

In accordance with a further embodiment, it is provided that a plurality of blocks each having a plurality of data input lines are provided, in which case, when an error occurs in a memory area addressed by a data input line of one of the blocks, the data change circuits for all the data input lines of the relevant block are controllable such that subsequent test data on the data input lines of the relevant block can be written in an altered manner to the memory circuit.

This has the advantage that, in integrated memory circuits in which defective memory cells can be replaced by redundant memory cells only in blockwise fashion, these blocks are "marked" as defective in their entirety as early as when the first error occurs. Therefore, an error is reliably detected during succeeding write/read operations and subsequent comparisons between the expected values supplied via the data input line, which correspond to the written-in test data in the case of error-free memory cells, and the read-out test data.

It may furthermore be provided that the comparator unit has a reset input in order to drive the data change circuit with the aid of a reset signal via the comparator unit in such a way that the transmitted test data can be written to the memory circuit again in an unaltered manner. This is carried out after each address change if a further memory area is to be tested. This has the advantage that the state in which data can initially be written in-in an unaltered manner is established before the beginning of renewed read-out and writing-in. If, during read-out, it is ascertained that data different than those previously written in are stored, then the comparator unit is switched again in such a way that subsequent data are written in an altered manner to the memory circuit.

A method for testing a memory circuit is provided in accordance with a further aspect of the present invention. In this case, test data are repeatedly transmitted from a tester unit and written to a memory area and subsequently read out. An error is detected if written-in and read-out test data are different. After the detection of an error in the memory area, the transmitted test data are inverted as they are written to the memory area, so that the test data transmitted via the data input line and the test data read out at a later point in time are different.

The method according to the invention has the advantage that, after the detection of an error, after a write/read operation, the subsequently written test data can no longer correspond to the read-out test data, as a result of which an error is detected in the subsequent test step as well. In this way, a memory area in which an error has already been detected is "marked" in such a way that an error is also detected during subsequent operations of reading from and writing to this memory area, even if the subsequent test operation by itself would not result in an error. This is done by data that are altered with respect to the transmitted data being written in the memory circuit if an error has previously been detected.

Consequently, it is possible to avoid the situation in which the addresses of the defective memory areas have to be transmitted to an external tester unit or an evaluation unit after each write/read operation. Instead, it is possible to store the error data in the memory itself and initially to carry out a plurality of write and read-out operations, the errors that occur in the process accumulating and a redundancy calculation being carried out only with the results of the last read-out operation.

It may furthermore be provided that, after the detection of an error in a memory area, the written-in test data are altered with respect to the transmitted test data for one or a plurality of further memory areas, so that the test data transmitted for the memory area and for the one or the plurality of further memory areas and the test data read therefrom are different.

In this way, when an error occurs in a memory cell or in a part of a memory area, the entire memory area can be "marked", so that, during subsequent write operations, data that are altered with respect to the test data are written to the memory area and an error is detected after the read-out operation for the entire memory area.

It may furthermore be provided that, at the end of a test sequence containing a plurality of write/read operations, error data are output to an evaluation unit, the error data specifying the differences between test data written in during the last write operation and test data read out during the last read operation. In this way, it is possible to transmit the collected error data of the write and read-out operations carried out in the test sequence to the evaluation unit in a single read-out operation. In comparison with the previous procedure of transmitting the error data to the evaluation unit after each write and read-out operation, the method thus constitutes a considerable acceleration of the evaluation operation by the evaluation unit because the volume of data to be transmitted to the evaluation unit is greatly reduced.

Other features which are considered as characteristic for the invention are set forth in the appended claims.

Although the invention is illustrated and described herein as embodied in a test circuit and a method for testing an integrated memory circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
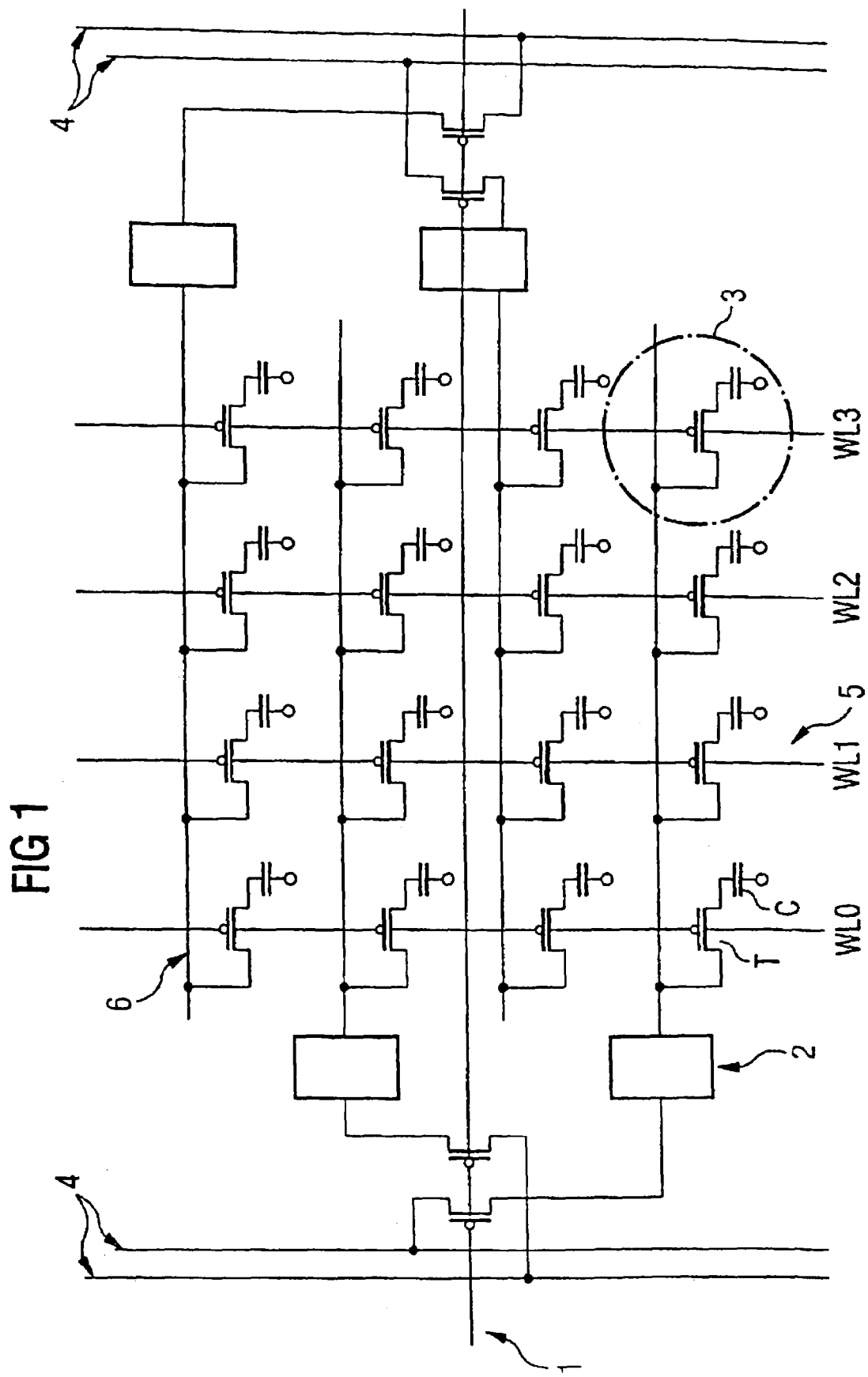
FIG. 1 is a circuit diagram of a memory area in an integrated memory circuit that can be replaced by a redundant memory area.

Referring now to the figures of the drawing in detail and first, particularly, to FIG. 1 thereof, there is shown a small excerpt from a memory matrix of an integrated memory circuit. The memory circuit is a 1-transistor DRAM memory circuit. A memory cell 3, containing a transistor T and a capacitor C, is respectively situated at crossover points between word lines 5 and bit lines 6.

The word lines 5 are in each case connected to a gate terminal of the transistor T, while a drain terminal of the transistor T is connected to the respective bit line 6. A source terminal of the transistor T is connected to a first terminal of the capacitor C. A second terminal of the capacitor C is connected to a fixed potential, preferably a ground potential.

The bit lines 6 are in each case connected to a sense amplifier 2, which, during a write operation, applies the charge to be written onto the respective bit line 6 and, during a read operation, amplifies the charge which flows via the activated transistor T through the capacitor C onto the bit line 6.

The sense amplifiers 2 can be connected to a local databus 4 via a common selection line 1.

If one of the memory cells 3 is defective, either the entire configuration containing four bit lines 6, selection lines and sense amplifiers 2 or the four memory cells on one of the word lines are replaced by a redundant configuration of the same size. All that is essential, then, for the repair of the memory circuit is to ascertain the combination of a selection line and/or word line for which an error occurred. The error information of the individual data lines can thus be internally compressed in a redundancy-conforming manner with the aid of an OR combination. Consequently, in the case of a module of 16-fold organization, only four bits per address have to be transmitted to the external tester.

A customary memory module has a maximum of 16 data inputs and outputs. However, by virtue of the SDRAM architecture with four independently operating banks within the memory circuit and data generation within the memory circuit, internally 64 data bits can be processed (read or written) in parallel. What is more, faster DRAM architectures such as DDR1 and DDR2 have a data prefetch of 2 and 4 bits, respectively. Therefore, internally the module operates with double and, respectively, quadruple the databus width. In the case of a DDR2 module of 16-fold organization, 64 bits per bank are written or read in parallel per internal cycle.

During the memory test, it cannot be assumed that all of the cells to be tested are functional. In the case of the possible errors, however, it is necessary to distinguish between so-called hard errors and soft errors. Whereas the former can be found by any arbitrary write-read test, detection of soft errors often necessitates highly specific critical conditions (voltages, frequency, topology, i.e. data patterns in the memory array, etc.) in order that the cell exhibits a defective behavior.

In order to trace soft errors, it is typically the case during the memory test that each address in the memory is accessed a number of times by read and write accesses. Between the various read and write accesses, the critical conditions are applied and changed in order to find out how sensitively the content of a memory cell reacts to changes in the external influences.

Figure 2:
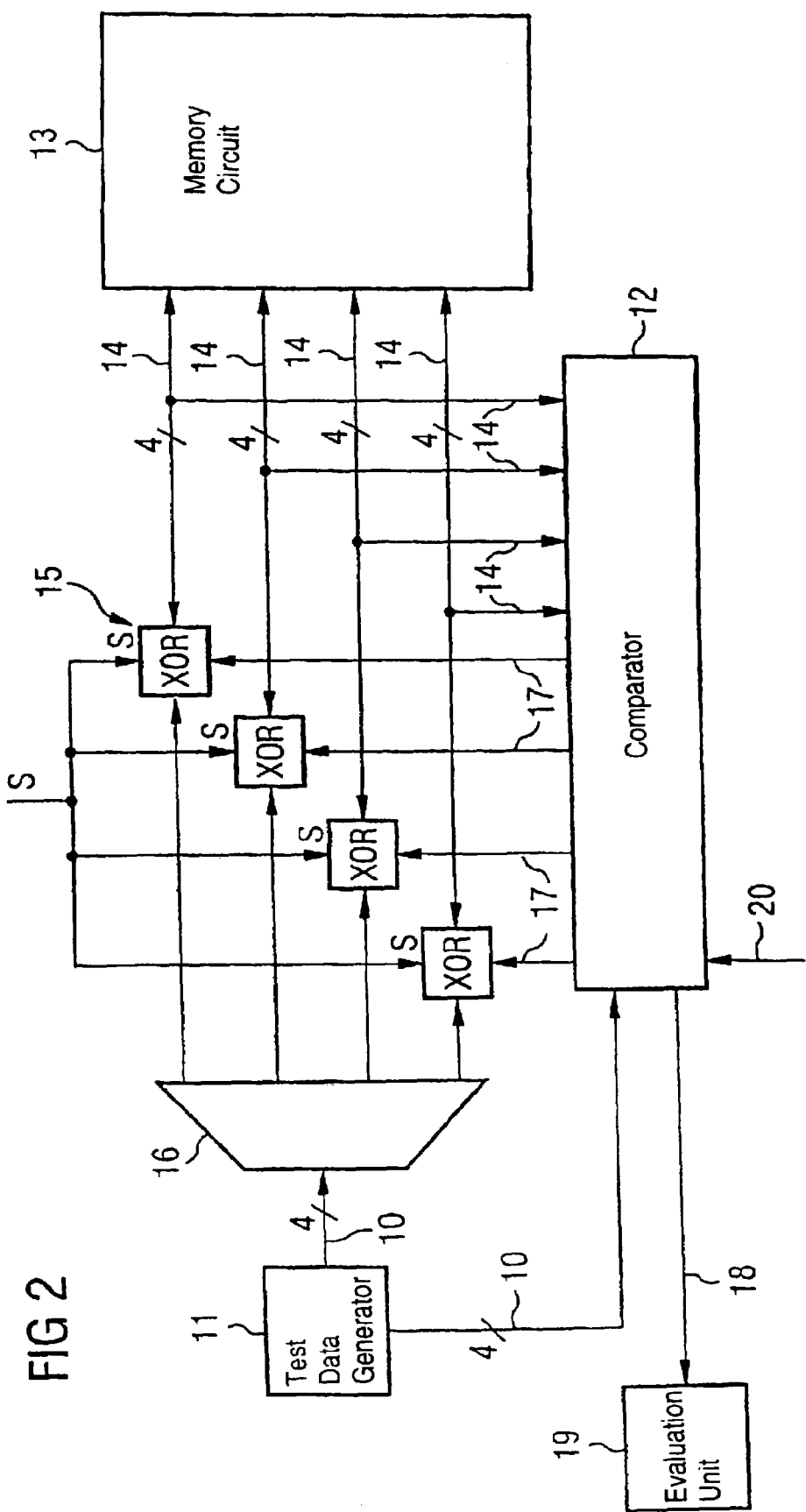
FIG. 2 is a block diagram of a test circuit in accordance with a preferred embodiment of the present invention.

FIG. 2 illustrates an embodiment of the test circuit according to the invention for testing an integrated memory circuit. Test data for testing a memory circuit 13 are made available by a test data generator 11. The integrated memory circuit 13 is preferably a DRAM memory circuit, it is possible also to apply the test method to other memory circuits, such as e.g. SRAM, MRAM, etc.

The test data generator 11 may be realized within the integrated circuit e.g. in the form of a built-in self-test (BIST) or may be situated outside the integrated circuit, for example in an external tester system. The control of the test data generator 11 can be carried out by suitable control signals.

The test data are applied to a test databus 10, which may have a different bit width depending on the configuration of the integrated circuit. In the present case, the databus 10 is represented with a width of 4 bits. The databus 10 is connected to a distributor device 16, in which the four lines of the databus 10 are divided into four memory databuses 14 each having four bit lines.

Each of the memory databuses 14 has a controllable data change circuit 15. The data change circuits 15 of the memory databuses 14 are in each case connected to a comparator unit 12 via a control line 17. The data change circuits 15 are preferably configured as exclusive-OR gates which, under the control of the control lines 17, either pass the datum on the respective bit line to the memory circuit 13 in an unaltered manner, or invert the datum on the respective bit line of the relevant memory databus 14. Each of the data change circuits 15 is configured such that the incoming data on the bit lines are either passed through in an unaltered manner or inverted.

Each of the data change circuits 15 furthermore has a control input S, to which a write enable signal can be applied, by which the exclusive-OR gates can be switched on or off.

The comparator unit 12 is connected both to the test databus 10 and to the memory circuit 13 via the memory databuses 14. After test data have been written to the memory circuit 13, the test data written to the memory circuit 13 are read out—possibly after a critical condition has been changed. During the read-out operation, with the aid of the control signal S, the exclusive-OR gates 15 are switched off and the test data generator 11 generates expected data which are transmitted via the databus 10 to the comparator unit 12 in order to compare the expected data with the data read from the memory circuit 13, which data are transmitted to the comparator unit via the memory databus 14. The expected data correspond to the data that have been written to the memory circuit 13 in the course of the test operation. If a difference is ascertained between the expected data transmitted by the test data generator 11 and the test data read from the memory circuit 13, an error signal is generated. The error signal can be transmitted via an error data line 18 to an evaluation unit 19, which is situated either in the integrated circuit or in the external test system.

The comparator unit 12 is configured in such a way that, under the control of a test program or hardware, it first carries out a number of write/read operations before it transmits error data via the error data line 18 to the evaluation unit 19.

During the testing of the memory circuit 13, then, test data are made available by the test data generator 11 and are first written to all the memory areas of the memory circuit 13 via the distributor device 16, usually a multiplexer, via the memory databuses 14. In this case, each of the memory databuses 14 accesses a cell group with 4 bits in each case, as is illustrated in FIG. 1. Thus, 16 bits are transmitted into the memory array per write access.

By setting a specific condition, the memory circuit 13 can then be brought to a critical state in which specific types of errors can occur. The test data stored in the relevant memory area of the integrated memory circuit 13 are then read out via the memory databuses 14 to the comparator unit 12. Essentially at the same time, the test data generator 11 supplies the expected data to the comparator unit 12 via the databus 10. The comparator unit 12 compares the expected data, which usually correspond to the test data previously written to the relevant memory area, with the test data read from the respective memory area. If no difference is ascertained in the comparison, the test sequence is continued by further test data being generated by the test data generator 11 and being written to the memory circuit 13 and subsequently being read out again, a comparison taking place during each read-out operation.

If an error is ascertained in one or a plurality of cells of the memory area to be tested in the integrated memory circuit 13, then a change control signal is generated for the memory databus 14 relevant to the defective memory cell and the control signal is transmitted via the corresponding control signal line 17 to the data change circuit 15 of the corresponding memory databus 14 via which the defective memory cell was written to. The control signal for controlling the data change circuit 15 is configured such that the data change circuit 15 maintains the newly assumed state, e.g. by a latch or the like, until a reset signal is transmitted via a further input 20 of the comparator unit 12. By virtue of the reset signal, the data change circuits 15 are reset into their original state, so that, during subsequent operations of writing to the memory circuit 13, the data change circuits do not perform inversion of the test data transmitted by the test data generator 11.

After one or a plurality of the data change circuits 15 have been switched on on account of the detection of an error in the memory area of the integrated memory circuit 13, new test data are written to the defective memory area. However, on account of the inversion by the data change circuit 15, the test data that are written to these memory areas are different from the data generated by the data generator 11. Renewed writing of test data to the memory area to be tested has the effect that all the test data which are transmitted via one of the memory databuses 14 and which pass through one of the data change circuits 15 which was previously changed over on account of the detection of an error are written in an altered manner to the memory area. During the subsequent read-out, the test data originally transmitted by the test data generator 11 are then compared with the altered test data in the comparator unit 12 and an error is thus ascertained again.

What is achieved in this way is that an error, once it has occurred, in a part of a memory area is permanently "marked", so that, after a number of write and read operations, error data can be transmitted via the error data line 18 to the evaluation unit 19, which is the totality of the errors that have accumulated in the preceding test sequences from a plurality of write/read operations. The error data may be, for example, results of the comparison of the content of each memory cell with the test data written thereto.

In the exemplary embodiment illustrated above, the data change circuit 15 is embodied in such a way that when an error occurs in a memory cell which is addressed via a bit line of the memory databus 14 connected to the data change circuit 15, all the test data for the relevant block of the memory area to be tested are altered in the subsequent write operations. The data change circuit 15 thus transmits an error that occurs in a memory cell of a part of the memory area to be tested to a plurality of memory cells, to four memory cells in the above-mentioned example. In subsequent read-out and write operations, all the memory cells associated with the defective part are thus again identified as defective and thus "marked". This is expedient because, during the redundancy calculation, usually not just one of the memory cells is replaced, rather blocks of a plurality of memory cells are in each case replaced. Thus, e.g. for the small memory area illustrated by way of example in FIG. 1, it is possible not to replace an individual memory cell by a redundant memory cell but rather to replace in each case the four memory cells connected to one of the word lines or all sixteen memory cells on a selection line.

An essential element of the invention is that the error data are not transmitted to the evaluation unit 19 immediately, rather first a number of a plurality of write and read operations for testing the respective memory area are carried out and only at the end thereof does a single operation of reading out the error data to the evaluation unit 19 take place. The error data then contain a redundancy-conforming compression of the error data. As a result, the volume of data transmitted to the evaluation unit 19 can be considerably reduced.

By virtue of the fact that the data change circuit 15 distributes the error information between a plurality of cells, the probability of an error not being detected is very low. This might be the case when the test data originally transmitted by the test data generator 11 are read despite modification of the data by the data change circuit 15 in the relevant memory cells. The probability of overlooking an error is greatly minimized by carrying out a plurality of test runs with different test patterns that end with a read-out of all the error data into the tester device.

Figure 3:
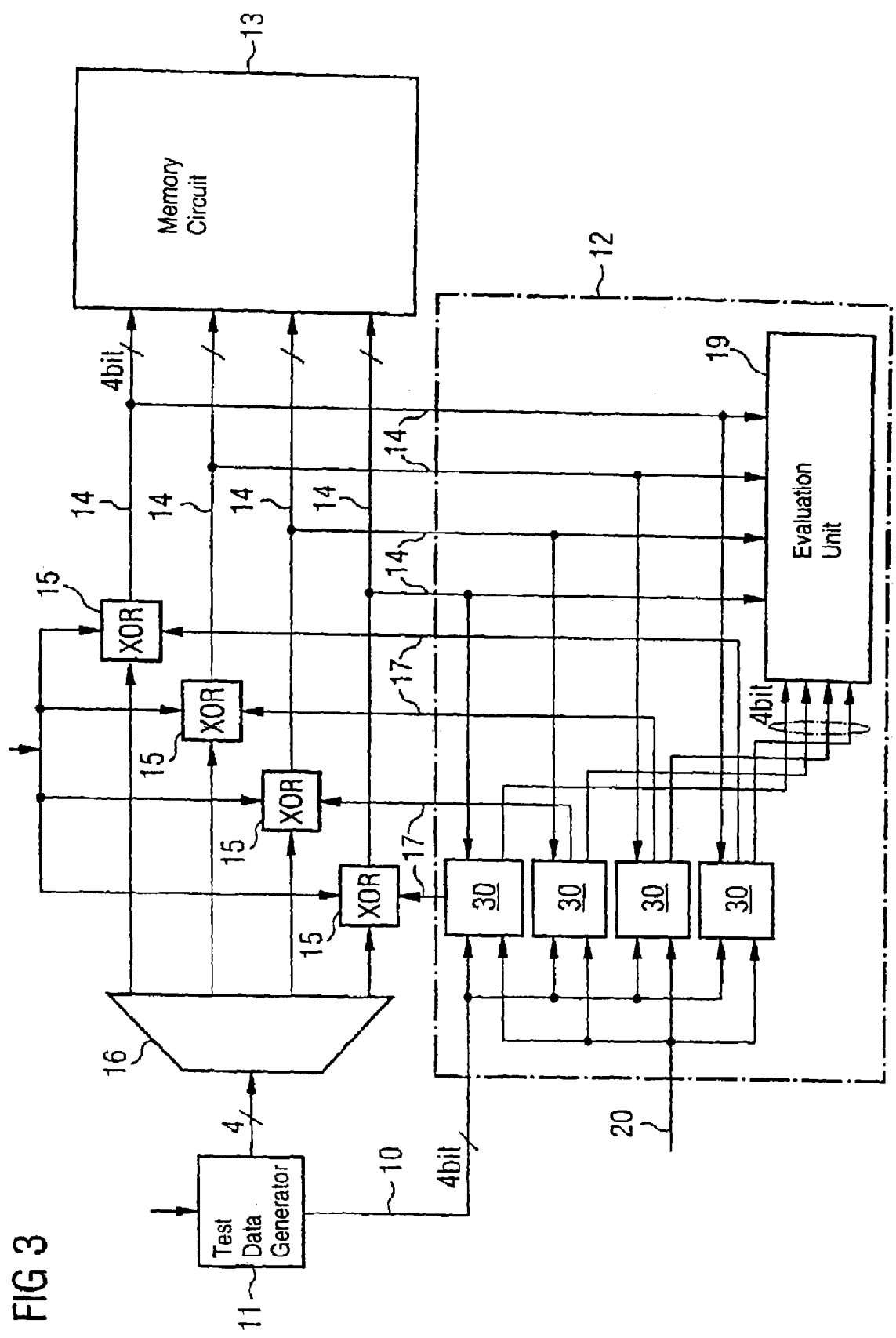
FIG. 3 is a block diagram of the test circuit with a possible configuration of the comparator unit.

FIG. 3 illustrates a possible configuration of the comparator unit 12. For each of the data change circuits 15, the comparator unit 12 provides a comparison element 30 by which a respective change control signal is made available via the control lines 17 for the respective data change circuit 15. The section of the memory data bus 14 that is connected to the data change circuit 15 that is driven via the respective comparison element 30 is connected to the associated comparison element 30. Each of the comparison elements 30 is connected to the data bus 10. Furthermore, each of the comparison elements 30 has a reset input to which a reset signal 20 can be applied.

The comparison elements 30 compare the expected data supplied by the test data generator 11 with the test data read from the memory area 13 and output the comparison result to the evaluation circuit 19. During read-out, it may be provided that the data change circuit 15 is deactivated, so that the read-out data are not influenced.

Figure 4:
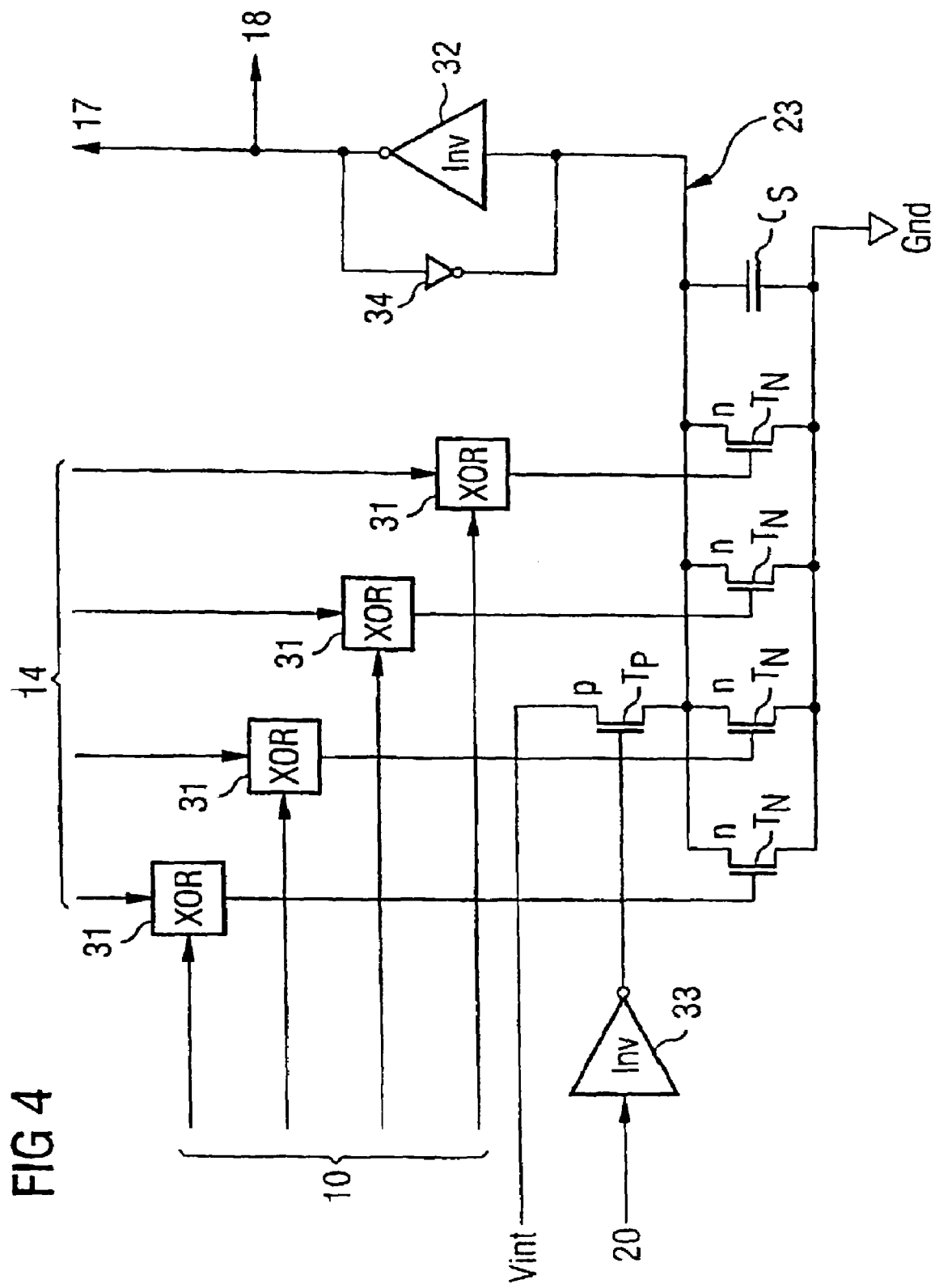
FIG. 4 is a circuit diagram for a comparator unit in accordance with the present invention.

FIG. 4 illustrates the comparison element 30, which essentially has an exclusive-OR gate 31 for each bit to be tested of the 4 bits per data change circuit 15. The exclusive-OR gate 31 carries out the actual comparison, the comparison result being compressed in a redundancy-conforming manner with a subsequent OR combination. To that end, the exclusive-OR gates 31 have inputs that are connected to the respective line of the data bus 10 and to the respective line of the memory data bus 14. Each of the exclusive-OR gates 31 is assigned an n-channel transistor, an output of the exclusive-OR gates 31 respectively being connected to the control input of a respective n-channel transistor $T_N$. First terminals of the n-channel transistors $T_N$ are connected to one another and to a fixed potential, preferably a ground potential GND. Further terminals of the n-channel transistors $T_N$ are connected via an inverter 32 to the data change circuits 15 via the change control line 17. The change control line 17 is simultaneously connected to the evaluation circuit 19 (via the error data line 18).

A p-channel transistor Tp is provided, at whose control input the inverted reset signal is present via the reset line 20 and an inverter 33. A fixed potential, preferably a supply voltage potential $V_{int}$, is present at a first terminal of the p-channel transistor Tp. A second terminal of the p-channel transistor Tp is connected to the second terminals of the n-channel transistors $T_N$. A first terminal of a storage capacitor Cs is connected to the first terminals of the n-channel transistors. The second terminal of the storage capacitor Cs is connected to the second terminals of the n-channel transistors $T_N$, i.e. the ground potential GND.

The OR combination of the comparison results of the exclusive OR gates 31 is realized via the node (node 23) formed by the second terminals of the n-channel transistors. During each address change, the reset signal 20 is activated and the p-channel transistor is thus activated, as a result of which the storage capacitor $C_s$ is charged to $V_{int}$. If one of the exclusive-OR gates 31 indicates an error during the read operation, then the node 23 is poled to ground via one of the n-channel transistors $T_N$ and the output signal on the change control line 17 assumes a logic "1" state. An error is indicated by the exclusive OR gates 31 by the output of the exclusive-OR gate assuming a high state.

In this embodiment, the capacitance of the node 23 must be chosen such that the precharged voltage $V_{int}$ is not discharged prematurely, i.e. before the conclusion of writing-back, by leakage currents. The capacitor $C_s$ must therefore hold the required charge until, after the read-out operation, the test pattern generator 11 has again written test data to the relevant memory area. As an alternative, it is also possible to use a full OR gate or to provide a minimally dimensioned inverter 34 as holding element for the inverter 32.

Thus, if one or more bits of a group of 4 bits are defective, then the change control signal is set on the control signal line 17. This leads to an inversion of the data via the exclusive-OR combination of the data change circuits 15 during the subsequent write operation. The accumulated error signal is additionally also output directly to the evaluation circuit 19 in order that the error information can also be assessed externally at least during the last reading. The error information then contains 4 bits for a memory area having a size of 16 bits.

In the method presented here, it is essential that an assessing reading of a cell is directly followed by a renewed write access in which, with the aid of the circuit proposed here, the data dependent on the read comparison are written back. The writing-back has to be effected directly afterward since the comparison circuit 12 is reset during an address change and the error information is not permanently stored. Precisely in march patterns, which are often used in the memory test, such a sequence is frequently encountered as so-called "read-modify-write".

The advantages of the approach are a separation of the read accesses that detect the error and the read-out. It is thus possible for both to be optimized independently. In particular the read-out with the transmission of the error addresses to the external test system can be chosen in such a way as to achieve the maximum transmission rate to the tester.

In typical DRAMs, this is a burst read access (Fast-Y), for example.

We claim:

1. A test circuit for testing a memory circuit, the test circuit comprising:
   a data input line for providing test data to be written to the memory circuit;
   a comparator unit connected to said data input line and to the memory circuit, said comparator unit comparing expected values received over said data input line with the test data read from the memory circuit, the test data previously having been written to the memory circuit over said data input line; and
   a data change circuit connected between said data input line and the memory circuit, said data change circuit being controllable depending on a result of a comparison performed in said comparator unit such that when an error occurs, further test data can be written to the memory circuit in a manner altered by said data change circuit;
   said data change circuit passing the test data in an unaltered form to said memory circuit if no error occurs and passing the test data in an inverted form to said memory circuit if an error occurs.

2. The test circuit according to claim 1, wherein the expected values correspond to the test data previously written to the memory circuit.

3. The test circuit according to claim 1, wherein:
said data change circuit is one of a plurality of data change circuits; and
said data input line is one of a plurality of data input lines each connected to one of said data change circuits, said data change circuits being controlled by said comparator device such that when the error occurs in a memory area addressed through one of said data input lines, each of said data change circuits is controlled such that the further test data on said plurality of data input lines can be written to the memory circuit in the altered manner.

4. A test circuit for testing a memory circuit, the test circuit comprising:
a data input line for providing test data to be written to the memory circuit;
a comparator unit connected to said data input line and to the memory circuit, said comparator unit comparing expected values received over said data input line with the test data read from the memory circuit, the test data previously having been written to the memory circuit over said data input line; and
a data change circuit connected between said data input line and the memory circuit, said data change circuit being controllable depending on a result of a comparison performed in said comparator unit such that when an error occurs, further test data can be written to the memory circuit in a manner altered by said data change circuit;
said data change circuit having a controllable exclusive-OR gate which, depending on a control signal generated by said comparator device, passes the test data in unaltered form to the memory unit or inverts the test data with an aid of an exclusive-OR function resulting in the further test data being altered test data.

5. The test circuit according to claim 3, further comprising a plurality of blocks each having a plurality of further data input lines connected between said comparator unit and the memory circuit, when the error occurs in the memory area addressed by one of said further data input lines of one of said blocks, said data change circuits for all of said further data input lines of a respective block are controllable such that the further test data on said further data input lines of said respective block can be written in the altered manner to the memory circuit.

6. The test circuit according to claim 1, wherein said comparison unit has a reset input for driving said comparison unit to not alter the test data in said data change circuit.

7. A method for testing a memory circuit, which comprises the steps of:
transmitting and writing test data to a memory area resulting in written-in test data;
reading-out the test data from the memory area resulting in read-out test data;
comparing the written-in test data to the readout test data;
determining an occurrence of an error if the written-in test data differs from and the read-out test data;
transmitting further test data after a detection of the error, the further test data being altered during writing to the memory area resulting in altered test data being written into the memory area such that a subsequent comparison of the altered test data read out and the further test data yields a difference; and
passing the test data to the memory area in an unaltered form if no error occurs, and passing the test data to the memory area in an inverted form if an error occurs.

8. The method according to claim 7, which further comprises writing the altered test data into at least one further memory area after the detection of the error in the memory area, so that the further test data transmitted for the memory area and for the at least one further memory area and the altered test data read therefrom are different.

9. The method according to claim 7, which further comprises altering the further test data into the altered test data with an aid of an exclusive-OR function after the detection of the error.

10. The method according to claim 7, which further comprises altering a specific operating parameter of the memory circuit between repeated writing-in and reading-out of the altered test data.

11. The method according to claim 7, which further comprises:
performing a plurality of write/read operations; and
outputting error data to an evaluation unit, the error data specifying differences between the further test data transmitted during a last write operation and the altered test data read out during a last read operation.

12. A method for testing a memory circuit, which comprises the steps of:
transmitting and writing test data to a memory area resulting in written-in test data;
reading-out the test data from the memory area resulting in read-out test data;
comparing the written-in test data to the read-out test data;
determining an occurrence of an error if the written-in test data differs from and the read-out test data;
transmitting further test data after a detection of the error, the further test data being altered during writing to the memory area resulting in altered test data being written into the memory area such that a subsequent comparison of the altered test data read out and the further test data yields a difference; and
passing the test data in unaltered form to the memory area or inverting the test data with the aid of an exclusive-OR function resulting in the further test data being altered test data, depending on the comparison.

* * * * *